United States Patent
Pan

(10) Patent No.: US 6,552,320 B1
(45) Date of Patent: Apr. 22, 2003

(54) IMAGE SENSOR STRUCTURE

(75) Inventor: Jui-Hsiang Pan, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/348,429

(22) Filed: Jul. 7, 1999

(51) Int. Cl.[7] .......................... H01L 27/00; H01L 31/00
(52) U.S. Cl. ............................. 250/208.1; 250/214.1; 250/226; 257/440
(58) Field of Search ................................. 257/292, 440; 250/208.1, 214.1, 226

(56) References Cited

U.S. PATENT DOCUMENTS 5,965,875 A * 10/1999 Merrill .................... 250/208.1

\* cited by examiner

*Primary Examiner*—Zandra V. Smith
(74) *Attorney, Agent, or Firm*—J. C. Patents

(57) ABSTRACT

An image sensor structure. A first PN photodiode is located in a photo-sensing region of a substrate. A second PN photodiode is located in the substrate above the first PN photodiode. An N-type terminal of the first PN photodiode connects to a source/drain region of a first transistor. A contact is coupled with the second PN photodiode. The contact connects to a gate of a second transistor.

5 Claims, 3 Drawing Sheets

IMAGE SENSOR STRUCTURE

BACKGROUND OF THE INVENTION

1. Field of the Invention

The present invention relates to a structure of an image sensor. More particularly, the present invention relates to a structure of a complementary metal oxide semiconductor (CMOS) image sensor.

2. Description of the Related Art

Most of the conventional digital sensors for image capture are charge-coupled devices (CCDs). CCD applications include monitors, video recorders, cameras, etc. However, CCDs have disadvantages such as high fabrication costs and limitations in size reduction. Thus, due to the current tendency to reduce costs and dimensions, a CMOS photodiode image sensor has been developed. Because the CMOS photodiode image sensor can be produced by conventional techniques and its costs and size can be reduced, it is predicted that CMOS photodiode image sensors will play a main role in sensors of the future.

A CMOS photodiode image sensor is substantially divided into a photo-sensing region, which is constructed by photodiodes, and a circuit region. A photodiode is a photosensitive device, also known as a photo-detecting device. The photodiode is based on the theory that a P-N junction can convert light into an electrical signal. In the absence of light, because the electrical field exists at a P-N junction, electrons in an N-doped layer and holes in a P-doped layer do not diffuse across the P-N junction, whereas when enough light strikes a photodiode of the photo-sensing region, electron-hole pairs are created and diffuse toward the P-N junction. As a result of an electrical field effect, the electrons flow to the N-doped region and the holes flow to the P-doped region. Thus, current is induced between P-N junction electrodes. Ideally, a photodiode in the dark is an open-circuit. In other words, no current is induced while the photodiode is in the dark.

In a conventional CMOS sensor, an N-type doped region is formed in a surface portion of a P-well. A depletion region formed at the junction between a P-well and the N-type doped region serves as a P-N junction. Since red light, blue light, and green light have different wavelengths, a CMOS sensor with a full color absorbency cannot be achieved by simply using the depletion region at the junction between the P-well and the N-type doped region.

SUMMARY OF THE INVENTION

The invention provides an image sensor structure. A substrate of a first conductive type is provided. A well of a second conductive type is located in the substrate. At least a first doped region of the first conductive type is located in a surface portion of the well. At least a second doped region of the first conductive type is located in a surface portion of the well. The first doped region is deeper than the second doped region. The first doped region and the second doped region are alternating, concentric regions. A terminal is located in the well. The first terminal connects to a source/drain region of a transistor of a circuit region. A contact is coupled with the well. The contact connects to a gate of a second transistor.

The invention also provides an image sensor structure. A first PN photodiode is located in a photo-sensing region of a substrate. A second PN photodiode is located in the substrate above the first PN photodiode. An N-type terminal of the first PN photodiode connects to a source/drain region of a first transistor. A contact is coupled with the second PN photodiode. The contact connects to a gate of a second transistor.

The present invention forms a photo-sensing region, which is constructed by a double photodiode. The double photodiode comprises the second photodiode above the first photodiode. Thus, red light, green light, and blue light are effectively absorbed. The image sensor having a full color absorbency is formed. In addition, the image sensor is formed without increasing the layout area compared with the conventional structure.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
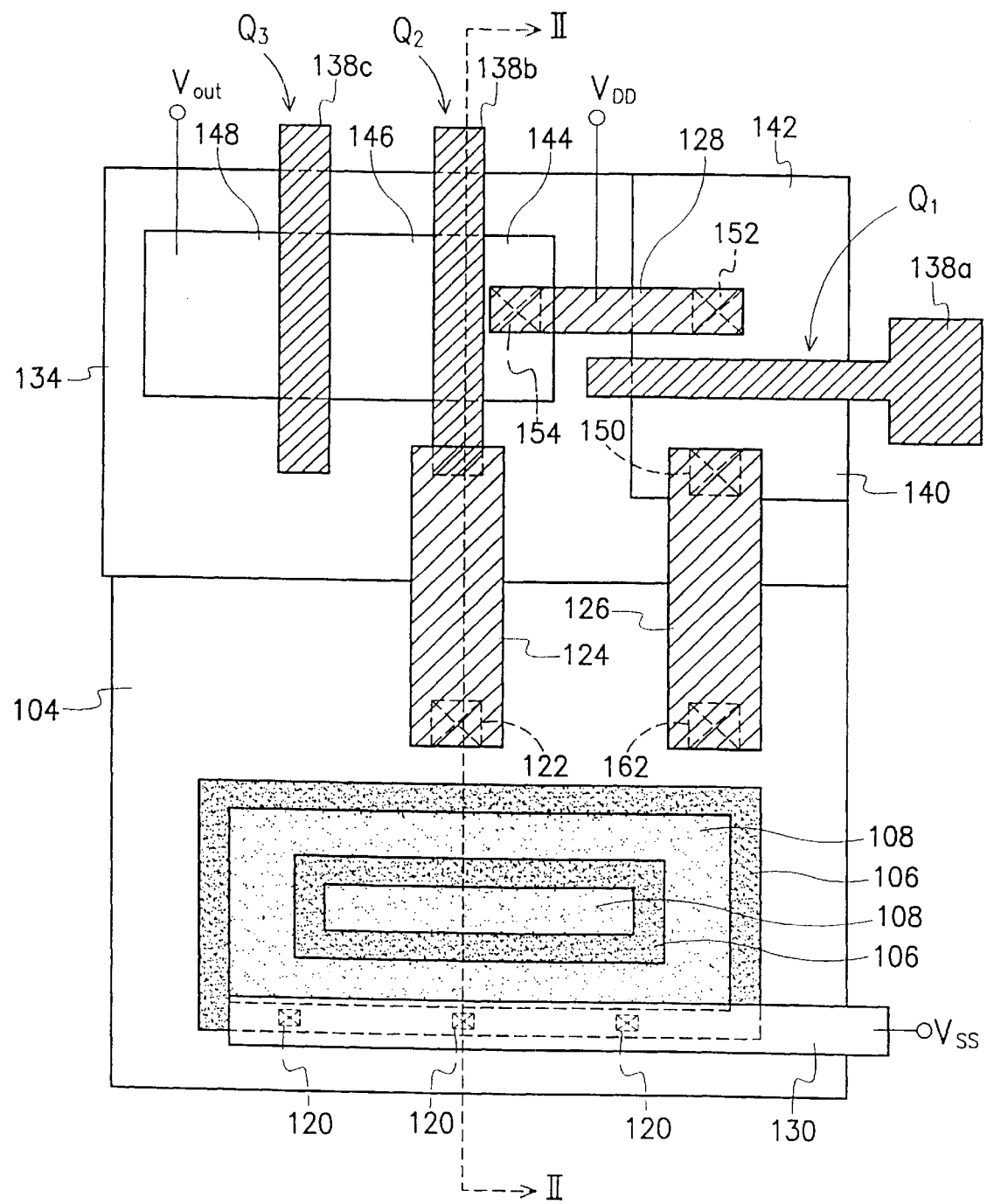
FIG. 1 is a schematic, top view of an image sensor according to one preferred embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
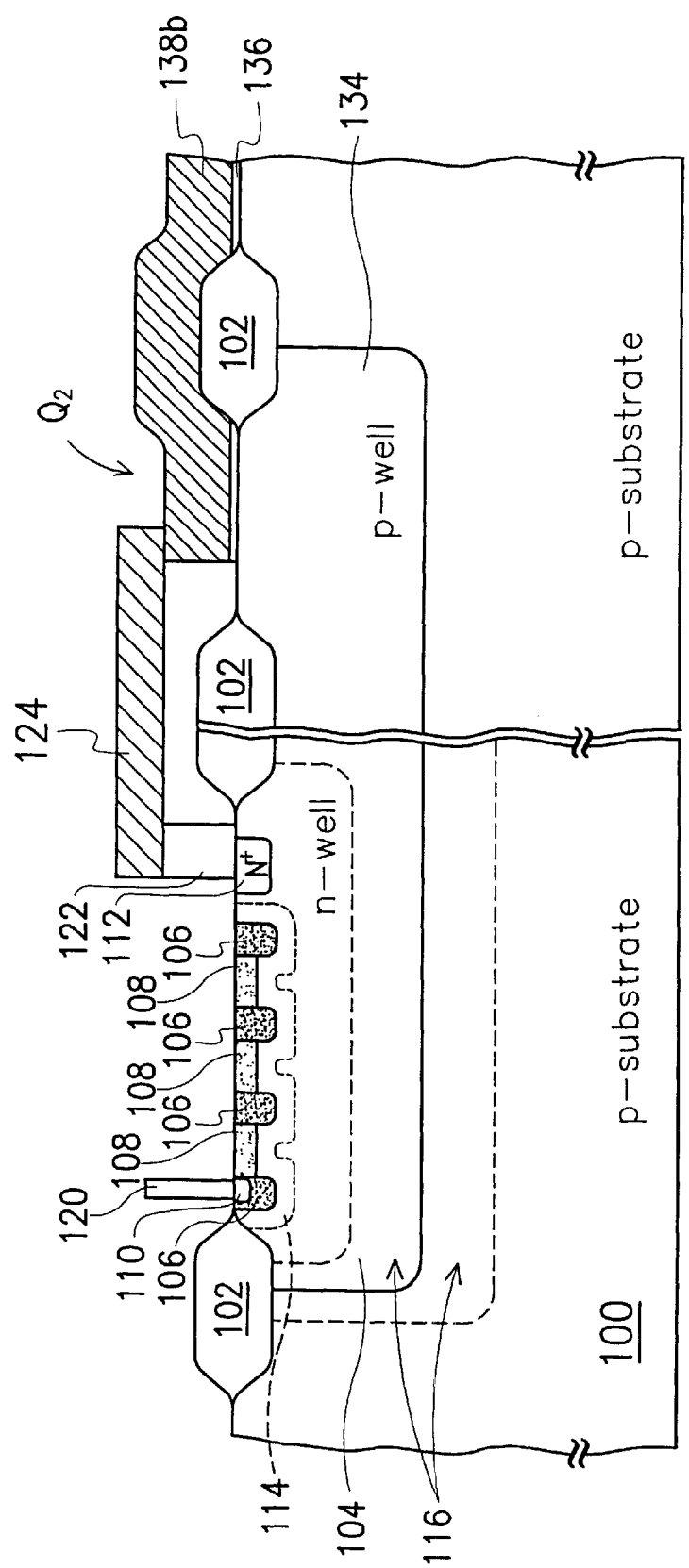
FIG. 2 is a schematic, cross-sectional view of FIG. 1 taken along line II—II.
Figure 3:
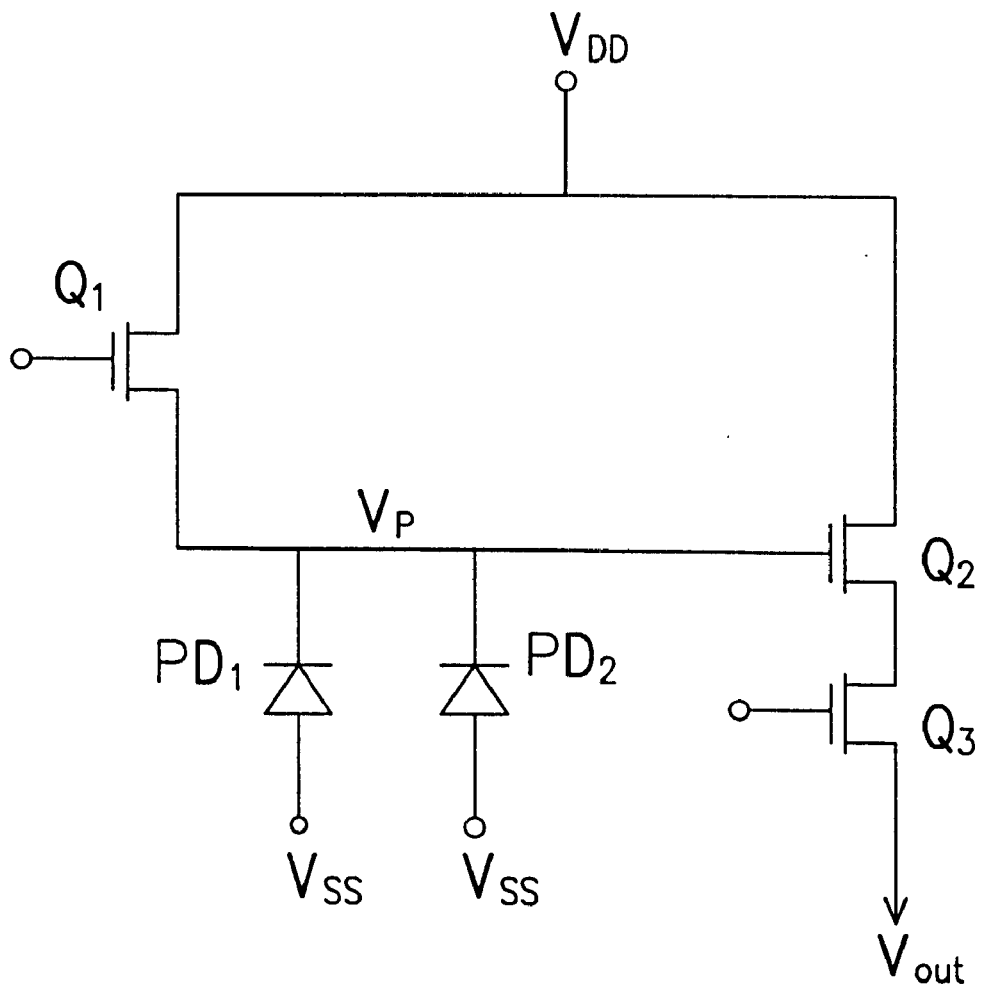
FIG. 3 is an equivalent circuit diagram for FIG. 1.

FIG. 1 is a schematic, top view of an image sensor according to one preferred embodiment of the invention. FIG. 2 is a schematic, cross-sectional view of FIG. 1 taken along line II—II. FIG. 3 is an equivalent circuit diagram for FIG. 1.

A unit cell of a complementary metal oxide semiconductor (CMOS) image sensor can be substantially divided into two regions including a photo-sensing region and a circuit region. The photo-sensing region is constructed in an N-well 104 in a P-type substrate 100. The circuit region is constructed in a P-well 134 in the substrate 100. The photo-sensing region and the circuit region are defined by a device isolation structure, such as a field oxide layer 102.

The preferred embodiment forms a double photodiode to construct the photo-sensing region. The double photodiode includes two photodiodes $PD_1$ and $PD_2$. The photodiode $PD_2$ is located in the substrate 100 above the photodiode $PD_1$ in the substrate 100. The image sensor obtains a full color absorbency by incorporating the photodiodes $PD_1$ and $PD_2$.

In the photo-sensing region, at least one deep $P^-$-type doped region 106 and one shallow $P^-$-type doped region 108 are formed in surface portions of the N-well 104. The $P^-$-type doped region 106 is deeper than the $P^-$-type doped region 108. The top-view layout of the $P^-$-type doped region 106 and the shallow $P^-$-type doped region 108 is constructed by alternating regions of the $P^-$-type doped region 106 and the shallow $P^-$-type doped region 108. The $P^-$-type doped regions 106 and the P⁻-type doped regions 108 are formed in alternating concentric regions, when viewed from the top. For example, as shown in FIG. 1, the P⁻-type doped region 108 is framed by the P⁻-type doped region 106 and the P⁻-type doped region 106 is, in turn, framed by the other P⁻-type doped region 108, which is framed by the other P⁻-type doped region 106 and so on. A depletion region 114 is formed at the junction between the N-well 104 and a combination structure of the deep P⁻-type doped region 106 and the shallow P⁻-type doped region 108. The depletion region 114 can be divided into portions directly under the deep P⁻-type doped region 106 and portions directly under the shallow P⁻-type doped region 108. In addition, a depletion region 116 is formed at the junction between the P-type substrate 100 and the N-well 104. Accordingly, a double photodiode comprising a photodiode of the P-type substrate 100/the N-well 104 and a photodiode of the N-well 104/the combination structure of the deep P⁻-type doped region 106 and the shallow P⁻-type doped region 108 is formed. The aforementioned two photodiodes are represented as $PD_1$ and $PD_2$, respectively, in the equivalent circuit diagram of FIG. 3.

The depletion regions 114 and 116 serve as P-N junction regions of photodiodes $PD_2$ and $PD_1$, respectively. Since the depths of the depletion regions 114 and 116 are different, the depletion regions 114 and 116 absorb different colors of light. The depletion region 114 directly under the deep P⁻-type doped regions 106 absorbs green light. The depletion region 114 directly under the shallow P⁻-type doped region 108 absorbs blue light. The depletion region 116 absorbs red light and green light having a longer wavelength than the green light absorbed by the depletion region 114.

In the preferred embodiment, the photo-sensing region includes the photodiode $PD_2$ above the photodiode $PD_1$. In this manner, the photo-sensing region with a full color absorbency is obtained without increasing the layout area compared with the conventional layout. The light with wavelengths having a range of from about 400 nm to about 700 nm is absorbed. The P⁻-type doped region 106 connects through, in sequence, a P⁺-type doped region 110 and the contact 120 to a conductive line 130. The P⁺-type doped region 110 serves as a terminal of the P⁻-type doped region 106. The voltage Vss, which is the voltage Vss applied to the $PD_2$ as shown in FIG. 3, is applied to the conductive line 130 and is grounded.

In addition, the N-well 104 connects through, in sequence, an N⁺-type doped region 112 and the contact 122, to the conductive line 124. The N⁺-type doped region 112 serves as a terminal of the N-well 104. The conductive line 124 further connects to a gate 138b of a transistor $Q_2$. In addition, the N-well 104 also connects through, in sequence, another terminal and a contact 162 to a conductive line 126. The conductive line 126 connects through a contact 150 to a source/drain region of a transistor $Q_1$.

When light transmits into the photo-sensing region, a current occurs at the depletion regions of P-N junctions of the photodiodes $PD_1$ and $PD_2$, so as to generate a signal. The voltage $V_p$ of the terminals of the N-well 104 thus is changed. The signal of the photo-sensing region is read by an output circuit of the circuit region.

As for the circuit region, the transistor $Q_3$ is a selected transistor. Thus, when the signal of the photo-sensing region is read, a selected array is turned on by the transistor $Q_3$, so as to obtain the voltage of the transistor $Q_2$. The voltage of the transistor $Q_2$ is related to the signal generated from the $V_p$, which is generated form light transmits through the photodiodes $PD_1$ and $PD_2$. In addition, the transistor $Q_1$ is used to reset the voltage of the circuit.

In summary, the invention includes at least the following advantages:

1. The photo-sensing region is constructed by a double photodiode. Thus, red light, green light, and blue light are effectively absorbed. An image sensor with a full color absorbency is achieved. The light with wavelengths having a range of from about 400 nm to about 700 nm is absorbed.
2. The present invention uses a first depletion region between an N-well and a P-type substrate and a second depletion region between the N-well and P-doped regions, which comprises deep P-doped regions and shallow P-doped regions, to form a double photodiode, so as to construct a photo-sensing region of a CMOS image sensor.
3. Since the first depletion region is deeper that the second depletion region, a photodiode is formed to absorb red light and green light with a longer wavelength.
4. Portions of the second depletion region between the N-well and the deep P-doped regions are used to absorb green light. Portions of the second depletion region between the N-well and the shallow P-doped region are used to absorb blue light.
5. The present invention forms a double photodiode, which has one photodiode above another photodiode. Thus, in comparison with the conventional method, the invention forms an image sensor having a full color absorbency without increasing the layout area.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. An image sensor structure comprising:

a substrate of a first conductive type;

a well of a second conductive type located in the substrate;

at least a first doped region of the first conductive type located in a surface portion of the well, wherein said well surrounds said first doped region;

at least a second doped region of the first conductive type located in a surface portion of the well, wherein the first doped region is deeper than the second doped region, and the first doped region and the second doped region are alternating concentric regions that frame each other a terminal located in the well, wherein the terminal connects to a source/drain region of a transistor of a circuit region; and a contact coupled with the well, wherein the contact connects to a gate of a second transistor.

2. The structure of claim 1, wherein the first conductive type is P-type and the second conductive type is N-type.

3. The structure of claim 1, wherein a first depletion region is located between the well and the first doped region for absorbing green light.

4. The structure of claim 1, wherein a second depletion region is located between the well and the second doped region for absorbing blue light.

5. The structure of claim 1, wherein a third depletion region is located between the well and the substrate for absorbing red light and green light having a longer wavelength than the wavelength of green light that is absorbed by the first depletion region.

* * * * *